United States Patent
Dattalo (10) Patent No.: US 9,891,763 B2
(45) Date of Patent: Feb. 13, 2018

(54) CURRENT FEEDBACK TECHNIQUES FOR CAPACITIVE SENSING

(71) Applicant: Synaptics Incorporated, San Jose, CA (US)

(72) Inventor: Tracy Scott Dattalo, Santa Clara, CA (US)

(73) Assignee: SYNAPTICS INCORPORATED, San Jose, CA (US)

(*) Notice: Subject to any disclaimer, the term of this patent is extended or adjusted under 35 U.S.C. 154(b) by 471 days.

(21) Appl. No.: 14/502,884

(22) Filed: Sep. 30, 2014

(65) Prior Publication Data
US 2016/0091999 A1  Mar. 31, 2016

(51) Int. Cl.
| | |
|---|---|
| *G06F 3/044* | (2006.01) |
| *G02F 1/1333* | (2006.01) |
| *H03K 17/955* | (2006.01) |
| *G06F 3/038* | (2013.01) |
| *H03K 17/96* | (2006.01) |

(52) U.S. Cl.
CPC ............ *G06F 3/044* (2013.01); *G06F 3/0383* (2013.01); *H03K 17/9622* (2013.01); *H03K 2217/96073* (2013.01); *H03K 2217/960745* (2013.01)

(58) Field of Classification Search
CPC .................. G06F 3/038; G06F 3/0383; G06F 3/041–3/0418; G06F 3/044; G02F 1/13338; H03K 17/945; H03K 17/955; H03K 17/96–17/9622; G01R 27/26; G01R 27/2605; G01D 5/24
See application file for complete search history.

(56) References Cited

U.S. PATENT DOCUMENTS

| | | | | |
|---|---|---|---|---|
| 5,659,387 A * | 8/1997 | Yoshida | ................... | G01C 3/08 |
| | | | | 356/4.01 |
| 6,377,056 B1 * | 4/2002 | Hanzawa | ................. | G01D 5/24 |
| | | | | 324/548 |
| 6,922,081 B2 * | 7/2005 | Frey | ................... | G01N 27/3277 |
| | | | | 204/403.14 |
| 7,015,705 B2 * | 3/2006 | Inaba | ................. | G01R 27/2605 |
| | | | | 324/658 |
| 8,018,238 B2 * | 9/2011 | Cormier, Jr. | ............ | G06F 3/044 |
| | | | | 324/678 |
| 8,085,247 B2 | 12/2011 | Wilson | | |
| 8,093,914 B2 | 1/2012 | Maharyta et al. | | |
| 2001/0008478 A1 * | 7/2001 | McIntosh | .............. | B81B 3/0086 |
| | | | | 361/115 |

(Continued)

*Primary Examiner* — Huy Q Phan
*Assistant Examiner* — David Frederiksen
(74) *Attorney, Agent, or Firm* — Patterson + Sheridan, LLP (57) ABSTRACT

Examples of the present disclosure generally provide current feedback techniques for capacitive sensing with an input device. A processing system for an input device includes an operational amplifier having a non-inverting input, an inverting input, and an output. A voltage source is coupled to the non-inverting input. A first voltage-controlled current source is coupled between the output and the inverting input to form a feedback path. A second voltage-controlled current source is coupled to the output and configured for modifying a charge on a capacitor based on a control voltage at the output. A determination module is coupled to the capacitor and configured for determining a capacitance measurement at the inverting input based on the charge on the capacitor.

25 Claims, 7 Drawing Sheets

(56) References Cited

U.S. PATENT DOCUMENTS

| | | | |
|---|---|---|---|
| 2003/0016849 A1* | 1/2003 | Andrade | G01L 1/146 |
| | | | 382/124 |
| 2006/0055416 A1* | 3/2006 | Kinoshita | G01D 5/24 |
| | | | 324/658 |
| 2010/0292945 A1 | 11/2010 | Reynolds et al. | |
| 2010/0327887 A1 | 12/2010 | Denison et al. | |
| 2011/0025629 A1 | 2/2011 | Grivna et al. | |
| 2012/0092030 A1* | 4/2012 | Roth | H03K 17/955 |
| | | | 324/679 |
| 2012/0206154 A1 | 8/2012 | Pant et al. | |
| 2012/0217981 A1 | 8/2012 | Erdogan et al. | |
| 2012/0229415 A1 | 9/2012 | Schwartz et al. | |
| 2012/0287077 A1 | 11/2012 | Pant et al. | |
| 2013/0015863 A1* | 1/2013 | Lamesch | B60N 2/002 |
| | | | 324/663 |
| 2013/0063395 A1 | 3/2013 | Byun et al. | |
| 2013/0257754 A1 | 10/2013 | Liu et al. | |
| 2013/0321324 A1* | 12/2013 | Golovchenko | G06F 3/044 |
| | | | 345/174 |
| 2014/0021966 A1 | 1/2014 | Shahrokhi et al. | |
| 2014/0035653 A1* | 2/2014 | Jeong | G06F 3/0418 |
| | | | 327/337 |

\* cited by examiner

CURRENT FEEDBACK TECHNIQUES FOR CAPACITIVE SENSING

BACKGROUND OF THE INVENTION

Field of the Invention

Embodiments of the present invention generally relate to a current feedback technique for capacitive sensing with an input device.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems, such as touchpads integrated in, or peripheral to, notebook or desktop computers. Proximity sensor devices are also often used in smaller computing systems, such as touch screens integrated in cellular phones or tablet computers.

Proximity sensor devices may include one or more types of electrodes that are configured for transmitting and/or receiving input sensing signals. The electrodes may be coupled to a processing system that determines various characteristics of acquired input sensing signals in order to detect the presence and/or location of an input object. Processing input sensing signals received via the electrodes generally requires large components, such as a number of large capacitors and/or resistors. For example, receiver components may be coupled to each individual electrode (or to each set of electrodes), requiring tens or hundreds of relatively large capacitors and/or resistors to be included in the proximity sensor device. In addition, as the feature size of proximity sensor devices is decreased, the number of receiver components generally must be increased, further increasing the size of the proximity sensor device.

Accordingly, there is a need for reducing the size of components used to perform input sensing in proximity sensor devices.

SUMMARY OF THE INVENTION

Embodiments of the present invention generally provide a processing system for an input device. The processing system includes an operational amplifier having a non-inverting input, an inverting input, and an output. A voltage source is coupled to the non-inverting input. The processing system further includes a first voltage-controlled current source, a second voltage-controlled current source, and a determination module. The first voltage-controlled current source is coupled between the output and the inverting input to form a feedback path. The second voltage-controlled current source is coupled to the output and configured for modifying a charge on a capacitor based on a control voltage at the output. The determination module is coupled to the capacitor and configured for determining a capacitance measurement at the inverting input based on the charge on the capacitor.

Embodiments of the present invention may further provide an input device for capacitive sensing. The input device includes a plurality of sensor electrodes and a processing system. The processing system is coupled to the plurality of sensor electrodes. The processing system includes an operational amplifier having a non-inverting input, an inverting input, and an output. A voltage source is coupled to the non-inverting input. The processing system further includes a first voltage-controlled current source, a second voltage-controlled current source, and a determination module. The first voltage-controlled current source is coupled between the output and the inverting input to form a feedback path. The second voltage-controlled current source is coupled to the output and configured to modify a charge on a capacitor based on a control voltage at the output. The determination module is coupled to the capacitor and configured to determine a capacitance measurement associated with a sensor electrode included in the plurality of sensor electrodes and coupled to the inverting input based on the charge on the capacitor. The determination module is further configured to determine positional information based on the capacitance measurement.

Embodiments of the present invention may further provide a method of input sensing with a sensor electrode. The method includes driving an input voltage onto a non-inverting input of an operational amplifier. A first voltage-controlled current source is coupled between an output of the operational amplifier and an inverting input of the operational amplifier to form a feedback path. The method further includes modifying, via a second voltage-controlled current source coupled to the output, a charge on a capacitor based on a control voltage at the output. The method further includes determining a capacitance measurement associated with a sensor electrode coupled to the inverting input based on the charge on the capacitor.

BRIEF DESCRIPTION OF THE DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only embodiments of the invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention generally provide a method and system for transmitting, receiving, and/or processing input sensing signals using a voltage-controlled current source (VCCS). Using a VCCS to perform input sensing allows the size of a processing system to be reduced. For example, instead of using large capacitors and/or resistors in a processing system, a VCCS may be implemented in a flexible manner to transmit, receive, and/or process various types of input sensing signals. Accordingly, the overall size of the processing system may be reduced.

Figure 1:
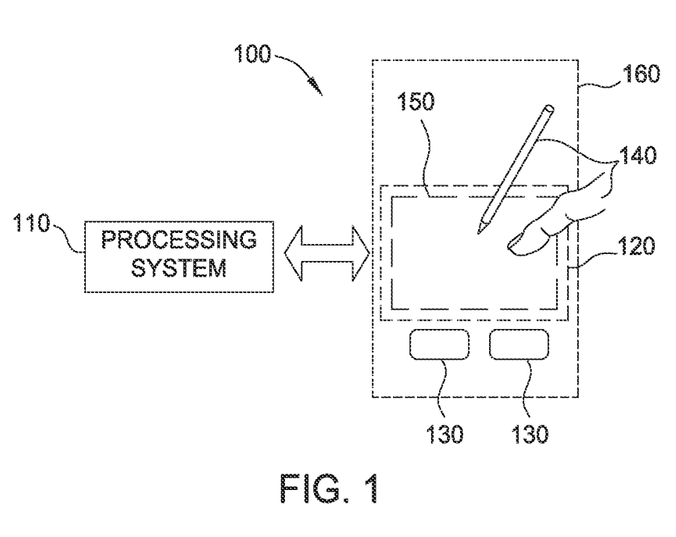
FIG. 1 is a block diagram of an exemplary input device in accordance with embodiments of the invention.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional examples of electronic systems include composite input devices, such as physical keyboards that include the input device 100 and separate joysticks or key switches. Further exemplary electronic systems include peripherals, such as data input devices (including remote controls and mice) and data output devices (including display screens and printers). Other examples include remote terminals, kiosks, and video game machines (e.g., video game consoles, portable gaming devices, and the like). Other examples include communication devices (including cellular phones, such as smart phones) and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections (including serial and/or parallel connections). Examples include I$^2$C, SPI, PS/2, Universal Serial Bus (USB), Bluetooth, RF, and IRDA.

In the embodiment depicted in FIG. 1, the input device 100 is shown as a proximity sensor device (also often referred to as a "touchpad" or a "touch sensor device") configured to sense input provided by one or more input objects 140 in a sensing region 120. Examples of input objects 140 include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100. The face sheet (e.g., an LCD lens) may provide a useful contact surface for an input object.

The input device 100 may utilize any combination of sensor components and sensing technologies to detect user input in the sensing region 120. The input device 100 comprises one or more sensing elements for detecting user input. Some implementations are configured to provide images that span one, two, three, or higher dimensional spaces. Some implementations are configured to provide projections of input along particular axes or planes. Cursors, menus, lists, and items may be displayed as part of a graphical user interface and may be scaled, positioned, selected scrolled, or moved.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In some implementations, an absolute capacitance sensing method operates by modulating sensor electrodes with respect to a reference voltage (e.g. system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. In other embodiments, receiver sensor electrodes may be modulated while resulting signals are received. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive. Additionally, sensor electrodes may be configured to perform absolute capacitance sensing and/or transcapacitance sensing during distinct time periods, or sensor electrodes may be configured to perform both absolute capacitance sensing and transcapacitance sensing simultaneously, during the same time period(s).

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. In some embodiments, the processing system 110 includes sensing circuitry that may include driver circuitry and/or receiver circuitry. For example, a processing system 110 for a mutual capacitance sensor device may comprise driver circuitry configured to drive input sensing signals onto the transmitter electrodes and/or receiver circuitry configured to receive signals with receiver electrodes. In other embodiments, the same sensing circuitry is used both to drive input sensing signals onto the sensing elements 150 and to receive resulting signals with the sensing elements 150. Additionally, the processing system 110 may also include electronically-readable instructions, such as firmware code, software code, and/or the like.

In some embodiments, components included in the processing system 110 are located together, such as near sensing elements 150 of the input device 100. In other embodiments, components of processing system 110 are physically separate with one or more components being located close to sensing elements 150 of the input device 100, and one or more components being located elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing elements 150 to detect input, identification modules configured to identify gestures such as mode changing gestures, and mode changing modules for changing operation modes.

In some embodiments, the processing system 110 responds to user input (or lack of user input) in the sensing region 120 directly by causing one or more actions to be performed. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing elements 150 of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. In additional examples, the processing system 110 may determine positional information, recognize inputs as commands, recognize handwriting, and the like.

"Positional information," as the term is used herein, broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in whole by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
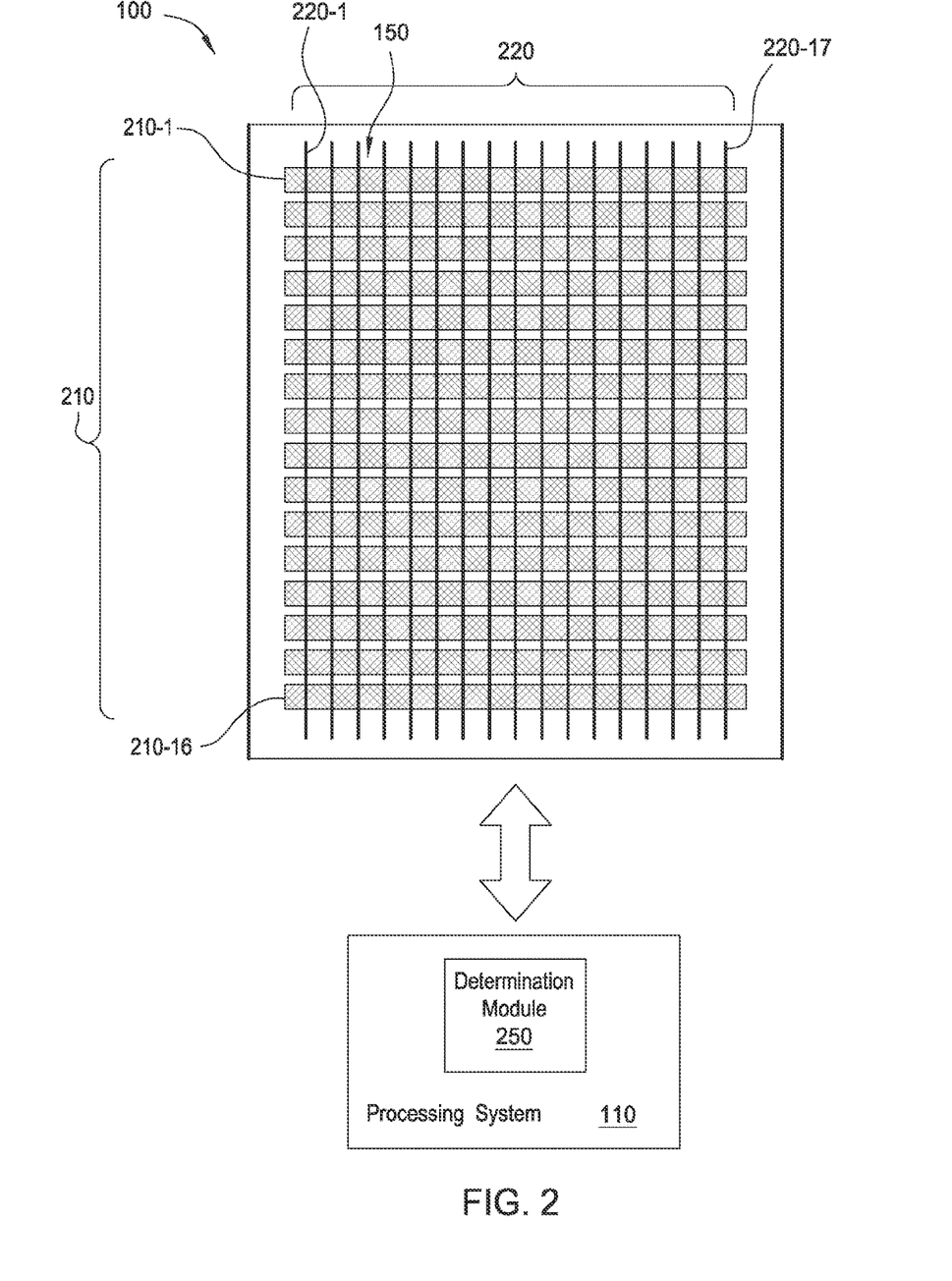
FIG. 2 is a partial schematic plan view of the input device of FIG. 1 in accordance with embodiments of the invention.

FIG. 2 is a partial schematic plan view of the input device 100 of FIG. 1 in accordance with embodiments of the invention. The input device 100 includes an array of sensing elements 150 and processing system 110. The array of sensing elements 150 includes sensor electrodes, such as a plurality of transmitter electrodes 210 (e.g., 210-1, 210-2, 210-3, etc.) and a plurality of receiver electrodes 220 (e.g., 220-1, 220-2, 220-3, etc.). Although the transmitter electrodes 210 and receiver electrodes 220 are illustrated as being rectangular, in other embodiments, the transmitter electrodes 210 and receiver electrodes 220 may be any practical geometric shape. The processing system 110 is coupled to the array of sensing elements 150, for example, through one or more routing traces (not shown in FIG. 2).

The sensing elements 150 may be formed on a substrate that is external to the display device 160. For example, the receiver electrodes 220 may be disposed on the outer surface of a lens of the input device 100, between the color filter glass of the display device 160 and the lens of the input device 100, or between a thin film transistor substrate (TFT substrate) and the color filter glass of the display device 160. In other embodiments, the transmitter electrodes 210 and/or the receiver electrodes 220 include one or more common electrodes that are used to perform input sensing and to update the display device 160.

Although the processing system 110 is illustrated in FIG. 2 embodied as a single integrated circuit (IC) (e.g., an integrated controller), the processing system 110 may include any appropriate number of ICs. For example, the functions of the processing system 110 may be implemented in more than one IC to drive input sensing signals (e.g., via driver circuitry) and/or receive resulting signals (e.g., via receiver circuitry) with the array of sensing elements 150. In some embodiments, the processing system 110 includes a determination module 250 that receives resulting signals (e.g., via receiver circuitry) and determines the presence of an input object 140 based on the resulting signals. For example, in some embodiments, the determination module 250 determines a capacitance measurement associated with one or more sensing elements 150 based on voltages, currents, charge, etc. received by receiver circuitry. Additionally, the processing system 110 may be configured to drive (e.g., via driver circuitry) a modulated signal onto the at least one sensing element 150 to detect changes in absolute capacitance between the at least one sensor electrode and an input object 140.

In some embodiments, one or more ICs of the processing system 110 may be implemented to control display device 160 elements. For example, one IC may be configured to perform input sensing, and another IC may be configured to perform display updating. In some embodiments, one IC may be configured to operate the transmitter electrodes 210, and another IC may be configured to operate the receiver electrodes 220. In embodiments where there is more than one IC, communications between separate ICs of the processing system 110 may be achieved through a synchronization mechanism, which sequences the signals provided to the common electrodes. Alternatively the synchronization mechanism may be internal to any one of the ICs.

Transmitter electrodes 210 and receiver electrodes 220 are ohmically isolated from each other by one or more insulators which separate the transmitter electrodes 210 from the receiver electrodes 220 and prevent them from electrically shorting to each other. The electrically insulative material separates the transmitter electrodes 210 and the receiver electrodes 220 at cross-over areas at which the electrodes intersect. In one such configuration, the transmitter electrodes 210 and/or receiver electrodes 220 are formed with jumpers connecting different portions of the same electrode. In other configurations, the transmitter electrodes 210 and the receiver electrodes 220 are separated by one or more layers of electrically insulative material or by one or more substrates, as described in further detail below. In still other configurations, the transmitter electrodes 210 and the receiver electrodes 220 are optionally disposed on a single layer of the input device 100. Accordingly, in such embodiments, no cross-over areas may exist between the transmitter electrodes 210 and the receiver electrodes 220.

The areas of localized capacitive coupling between transmitter electrodes 210 and receiver electrodes 220 may be termed "capacitive pixels." The capacitive coupling between the transmitter electrodes 210 and receiver electrodes 220 changes with the proximity and motion of input objects in the sensing region 120 associated with the transmitter electrodes 210 and the receiver electrodes 220. In other embodiments, such as embodiments that include matrix sensors, the term "capacitive pixels" may refer to the localized capacitance (e.g., absolute capacitance) between a sensing element 150 and an input object 140.

In some embodiments, the sensor pattern is "scanned" to determine these capacitive couplings. That is, the transmitter electrodes 210 are driven to transmit transmitter signals. Transmitters may be operated such that one transmitter electrode 210 transmits at one time, or multiple transmitter electrodes 210 transmit at the same time. Where multiple transmitter electrodes 210 transmit simultaneously, these multiple transmitter electrodes 210 may transmit the same transmitter signal and effectively produce an effectively larger transmitter electrode 210, or these multiple transmitter electrodes 210 may transmit different transmitter signals. For example, multiple transmitter electrodes 210 may transmit different transmitter signals according to one or more coding schemes that enable their combined effects on the resulting signals of receiver electrodes 220 to be independently determined. Additionally, in embodiments that implement matrix sensing techniques, the sensing elements 150 may be scanned to sense changes to absolute capacitance on the electrodes.

The receiver electrodes 220 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region 120. For example, successive capacitive images acquired over successive periods of time can be used to track the motion(s) of one or more input objects 140 entering, exiting, and within the sensing region 120.

As described above, the processing system 110 may include sensing circuitry that is coupled to the sensor electrodes. In some embodiments, separate sensing circuitry may be coupled to each sensor electrode. In other embodiments, the sensor electrodes may be grouped into electrode sets that include any number of sensor electrodes (e.g., 2, 4, 8, 16, 32, etc. sensor electrodes per electrode set), and separate sensing circuitry may be coupled to each electrode set. Consequently, the processing system 110 may include tens, hundreds, thousands, etc. of separate sensing circuits.

Typically, sensing circuits included in a processing system implement relatively large components, such as large capacitors and/or resistors. For example, in a processing system that includes 32 separate sensing circuits—each coupled to one or more sensor electrodes—each sensing circuit may include a capacitor that is approximately 30 picofarads (pF). As a result, the total surface area required by all of the sensing circuits may be quite large.

Accordingly, in order to reduce the size requirements of sensing circuitry (e.g., driver circuitry and/or receiver circuitry) included in the processing system 110, one or more components within the sensing circuitry may be replaced with a voltage-controlled current source (VCCS). Replacing one or more sensing circuitry components with a VCCS may allow the surface area of the processing system 110 to be reduced while still enabling input sensing signals to be accurately transmitted, received, and/or processed by the processing system 110. Such techniques are described in further detail below in conjunction with FIGS. 3-7.

Current Feedback Techniques for Capacitive Sensing

Figure 3:
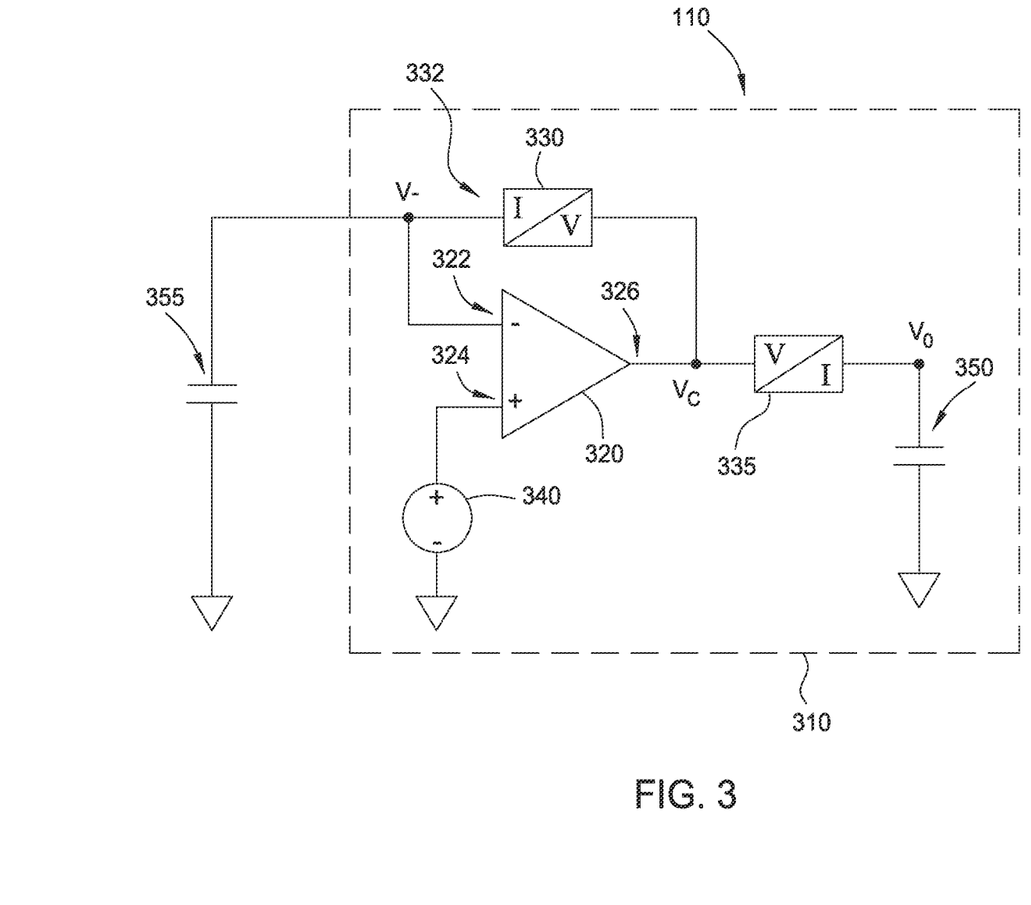
FIG. 3 is a partial schematic view of a sensing circuit included in the processing system of FIG. 1 in accordance with embodiments of the invention.

FIG. 3 is a partial schematic view of a sensing circuit 310 included in the processing system 110 of FIG. 1 in accordance with embodiments of the invention. The sensing circuit 310 may include an operational amplifier 320, a first voltage-controlled current source (VCCS) 330, a second VCCS 335, a voltage source 340, and a known capacitor 350 having a known capacitance value. The sensing circuit 310 may be coupled to an unknown capacitor 355 having an unknown capacitance value. In some embodiments, the unknown capacitor 355 may include a sensor electrode (e.g., a transmitter electrode 210 or a receiver electrode 220) or a set of sensor electrodes. The operational amplifier 320 includes an inverting input 322, a non-inverting input 324, and an output 326.

As shown, the first VCCS 330 is coupled between the output 326 of the operational amplifier 320 and the inverting input 322 of the operational amplifier 320 to form a feedback path 332. The second VCCS 335 is coupled between the output 326 of the operational amplifier 320 and the known capacitor 350. The voltage source 340 is coupled to the non-inverting input 324 of the operational amplifier 320.

During operation of the sensing circuit 310, an input voltage is applied to the non-inverting input 324 by the voltage source 340, producing a control voltage $V_C$ at the output 326 of the operational amplifier 320. The control voltage $V_C$ at the output 326 of the operational amplifier 320 then causes the first VCCS 330 to generate a current, which modifies the charge stored by the unknown capacitor 355. Similarly, the control voltage $V_C$ at the output 326 of the operational amplifier 320 causes the second VCCS 335 to generate a current, which modifies the charge stored by the known capacitor 350.

In various embodiments, there is a known relationship between the current at the output of the first VCCS 330 at a given control voltage $V_C$ and the current at the output of the second VCCS 335 at that same control voltage $V_C$. Accordingly, by monitoring changes to a voltage $V_C$ across the known capacitor 350, an amount of charge that has been transferred to or received from the unknown capacitor 355 can be determined. Additionally, the operational amplifier 320 will respond to changes in the amount of charge stored by the unknown capacitor 355 by modifying the control voltage $V_C$. Then, in response to changes to the control voltage $V_C$, the second VCCS 335 may add charge to or remove charge from the known capacitor 350. Consequently, changes in the amount of charge stored by the unknown capacitor 355 can be determined based on changes to the voltage $V_C$ across the known capacitor 350.

In some embodiments, a scaling factor K is used to establish a relationship between the voltage/current behavior of the first VCCS 330 and the voltage/current behavior of the second VCCS 335. For example, the second VCCS 335 may be designed to produce a known fraction (e.g., one-half, one-quarter, one-tenth, etc.) of the current produced by the first VCCS 330 at a given voltage. By designing the sensing circuit 310 such that the second VCCS 335 produces less current than the first VCCS 330 at a given voltage, a smaller known capacitor 350 may be used, decreasing the overall size of the sensing circuit 310. That is, when the second VCCS 335 is designed to produce less current than the first VCCS 330 at a given voltage, the known capacitor 350 does not need to have the same capacitance as the unknown capacitor. Instead, to determine the capacitance of the unknown capacitor 355, a scaling factor K may be applied to the voltage $V_O$ across the known capacitor 350. In other embodiments, however, the first VCCS 330 and the second VCCS 335 may have substantially the same voltage/current characteristics, enabling characteristics of the unknown capacitor 355 to be inferred directly from characteristics of the known capacitor 350, without applying a scaling factor.

In addition to, or instead of, using a scaling factor K to compensate for differences between the first VCCS 330 and the second VCCS 335, the second VCCS 335 may use a charge cancellation technique and/or offset technique in order to allow the size of the known capacitance 350 to be reduced. For example, a charge cancellation technique used by the second VCCS 335 may remove a fixed amount of charge from known capacitor 350 when certain criteria are met. One type of charge cancellation technique that may be used is coarse baseline correction (CBC). In order to perform CBC, one side of an adjustable capacitor may be coupled to an input (e.g., V_ and V_') of each sensing circuit, while the other side of the adjustable capacitor is driven with a voltage source. Thus, the adjustable capacitor may cancel an amount of charge that is equal to the ΔV of the voltage source multiplied by the capacitance of the adjustable capacitor. In some embodiments, CBC may be performed by generating a square wave with the voltage source. The square wave may have a polarity that is opposite to the polarity of an input sensing signal that is being transmitted to the sensor electrode.

Additionally, one type of charge subtraction technique that may be used is a current conveyor (CC). The CC includes a reference capacitor and a voltage source. The CC measures an amount of charge that is delivered by the voltage source to the reference capacitor, multiplies the amount of charge by a factor (e.g., 2, 5, 10, etc.), and then delivers the multiplied charge to an unknown capacitance (e.g., unknown capacitance 355). Accordingly, in any of the techniques described above, the charge on the known capacitor (e.g., known capacitor 350) will be the difference between the amount of charge that is needed to shift the voltage at the inverting input (e.g., inverting input 322) to the voltage at the non-inverting input (e.g., non-inverting input 324) and the amount of charge that was cancelled, offset, subtracted, etc. Thus, the amount of charge transferred to or from the unknown capacitor 355 may be tracked while allowing the size of the known capacitor 350 to be reduced.

In various embodiments, the capacitance of the unknown capacitor 355 may be determined using Equations 1-4, where $Q_{unknown}$ is the charge on the unknown capacitor 355, $C_{unknown}$ is the capacitance of the unknown capacitor 355, V− is the voltage applied to the unknown capacitor 355, $Q_{known}$ is the charge on the known capacitor 350, $C_{known}$ is the capacitance of the known capacitor 350, $V_O$ is the voltage applied to the known capacitor 350, and K is the scaling factor.

$$Q_{unknown} = C_{unknown} V_- \quad \text{(Eq. 1)}$$

$$Q_{known} = K Q_{unknown} \quad \text{(Eq. 2)}$$

$$V_O = \frac{Q_{known}}{C_{known}} \quad \text{(Eq. 3)}$$

$$C_{unknown} = \frac{C_{known} V_O}{V_- / K} \quad \text{(Eq. 4)}$$

As described above, the unknown capacitor 355 may include one or more sensor electrodes. For example, in an absolute capacitance sensing configuration, one or more sensor electrodes are coupled to the inverting input 322 and first VCCS 330 of the sensing circuit 310, and the voltage source 340 is configured to drive an input sensing signal (e.g., a square wave, sinusoidal voltage, constant voltage, etc.) onto the non-inverting input 324 of the operational amplifier 320. In response, the operational amplifier 320 outputs a control voltage $V_C$, causing the first VCCS 330 to add charge to and/or remove charge from the sensor electrode(s). Additionally, outputting the control voltage $V_C$ causes the second VCCS 335 to add charge to and/or remove charge from the known capacitor 350. Further, changes to the unknown capacitor 355 may be detected by tracking the voltage $V_O$ across the known capacitor 350 using Equation 4, described above. Accordingly, by tracking the amount of charge added to and/or removed from the known capacitor 350, changes to the capacitance of the sensor electrode(s) (e.g., due to the presence or absence of an input object 140) may be determined.

Thus, including the first VCCS 330 in the feedback path 332 of the sensing circuit 310 enables the size of the sensing circuit 310 to be reduced while still enabling the sensing circuit 310 to accurately determine an amount of charge transferred to and/or received from an unknown capacitor. Additional techniques for utilizing a VCCS to perform input sensing are described below.

Figure 4:
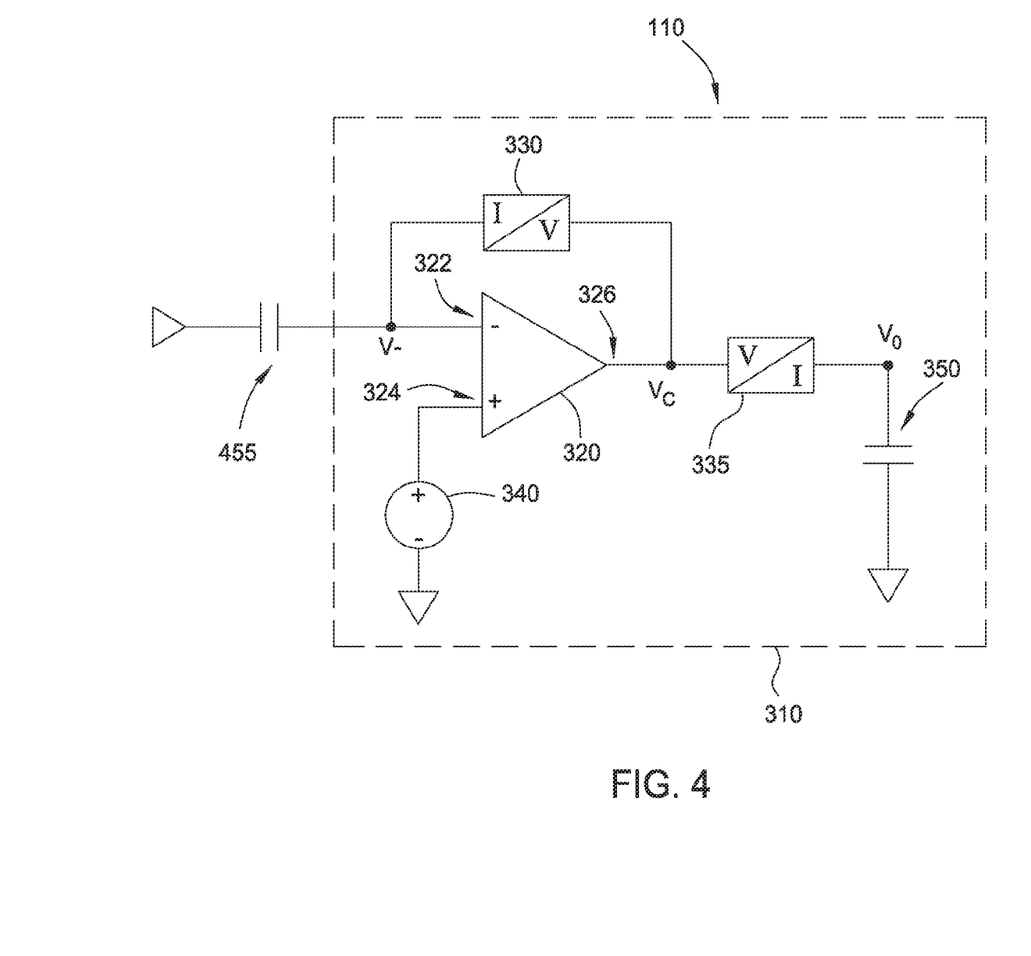
FIG. 4 is a partial schematic view in which the sensing circuit of FIG. 3 is configured for transcapacitive sensing in accordance with embodiments of the invention.

FIG. 4 is a partial schematic view in which the sensing circuit 310 of FIG. 3 is configured for transcapacitive sensing in accordance with embodiments of the invention. As shown, the sensing circuit 310 may be coupled to an unknown capacitance 455 that is configured for transcapacitive sensing. For example, in some embodiments, the inverting input 322 of the operational amplifier is electrically coupled to one or more sensor electrodes (e.g., one or more receiver electrodes), and the one or more sensor electrodes are capacitively coupled to one or more transmitter electrodes 210 included in the input device 100.

When performing transcapacitive sensing with the sensing circuit 310, the voltage source 340 coupled to the non-inverting input 324 may be held at a substantially constant voltage. Then, while receiving an input sensing signal from one or more transmitter electrodes 210, changes to the voltage V− at the inverting input 322 will cause the second VCCS 335 to modify the charge on the known capacitor 350. Changes to the unknown capacitance 455 (e.g., due to the input sensing signal and/or due to the presence or absence of an input object 140) may then be determined (e.g., via determination module 250) based on the voltage $V_O$ across the known capacitor 350, for example, using Equation 4, described above.

Figure 5:
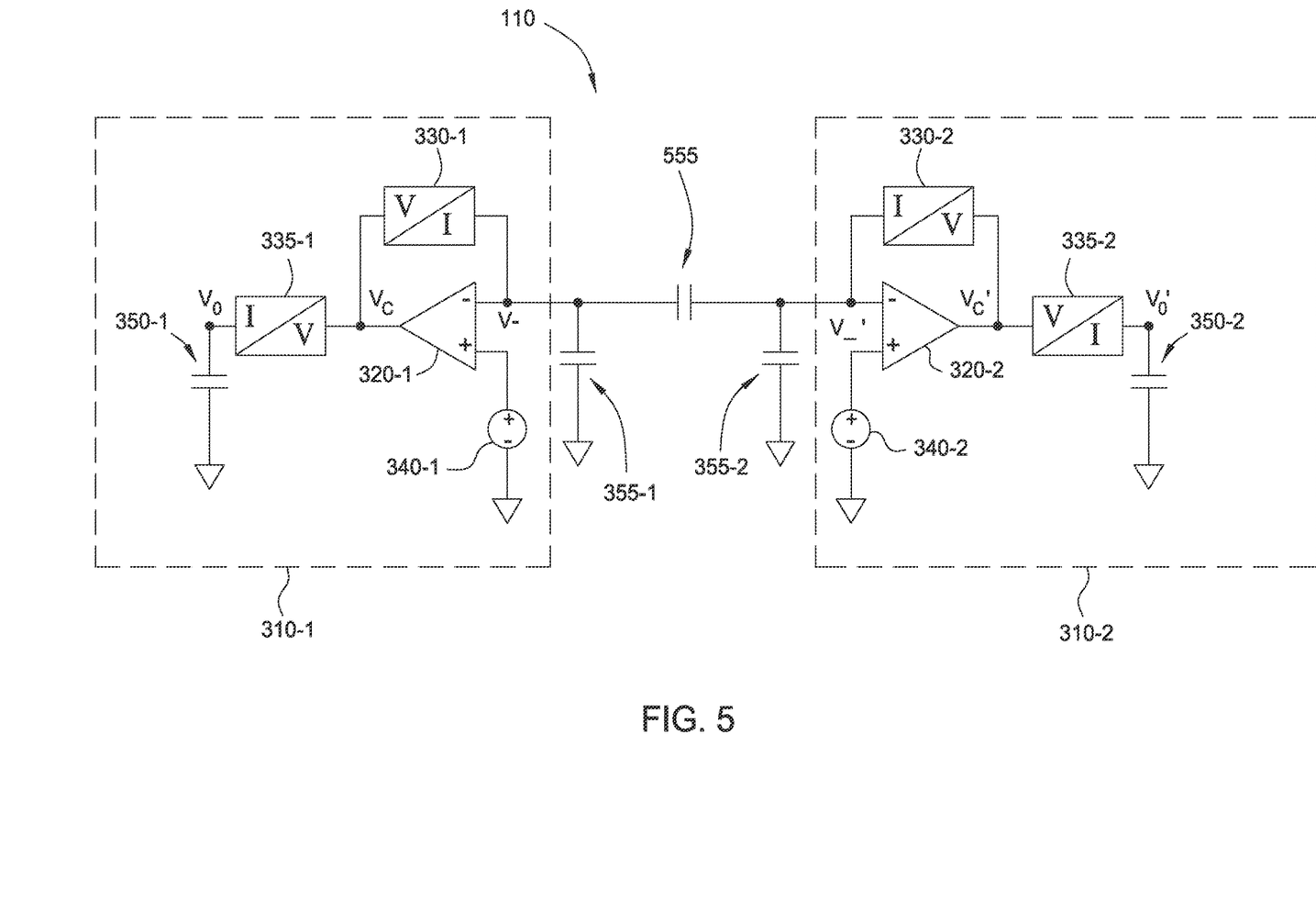
FIG. 5 is a partial schematic view of a processing system that includes two sensing circuits configured to perform transcapacitive sensing and/or absolute capacitance sensing in accordance with embodiments of the invention.

FIG. 5 is a partial schematic view of a processing system 110 that includes two sensing circuits 310 configured to perform transcapacitive sensing and/or absolute capacitance sensing in accordance with embodiments of the invention. In some embodiments, sensing circuit 310-1 is coupled to one or more first sensor electrodes, and sensing circuit 310-2 is coupled to one or more second sensor electrodes. Thus, a first unknown capacitor 355-1 may correspond to the absolute capacitance of the first sensor electrode(s), and a second unknown capacitor 355-2 may correspond to the absolute capacitance of the second sensor electrode(s). Additionally, a third unknown capacitor 555 may correspond to the capacitive coupling between the first sensor electrode(s) and the second sensor electrode(s).

When performing transcapacitive sensing, the first sensor electrode(s) may be operated as transmitter electrode(s) 210, and the second sensor electrode(s) may be operated as receiver electrode(s) 220. In such embodiments, the voltage source 340-2 included in sensing circuit 310-2 may apply a constant voltage to the non-inverting input of operational amplifier 320-2. Accordingly, because V−' is being held at a substantially constant voltage, substantially no current will flow through the second unknown capacitor 355-2. Then, the voltage source 340-1 included in sensing circuit 310-1 may apply a voltage (e.g., a square wave, sinusoidal voltage, etc.) onto the non-inverting input of the operational amplifier 320-1, causing an input sensing signal to be driven onto the transmitter electrode(s) 210. A total amount of current driven onto the transmitter electrode(s) 210 ($I_{TX}$) may be determined (e.g., via determination module 250) by the sensing circuit 310-1 based on the voltage $V_C$ across the known capacitor 350-1. Additionally, while sensing circuit 310-1 is driving the input sensing signal onto the transmitter electrode(s), a total amount of current received by the receiver electrode(s) 220 ($I_{RX}$) from the transmitter electrode(s) 210 may be determined based on the voltage $V_O'$ across the known capacitor 350-2. The total amount of current driven from the transmitter electrode(s) 210 to the receiver electrode(s) 220 ($I_{RX}$) may then be used to determine the capacitance of the third unknown capacitor 555. Additionally, because there is substantially no current through the second unknown capacitor 355-2 (while V–' is being held at a substantially constant voltage), the amount of current received by the first unknown capacitor 355-1 ($I_{CTX}$) may be determined by subtracting the total amount of current received by the receiver electrode(s) 220 ($I_{RX}$) from the total amount of current driven onto the transmitter electrode(s) 210 ($I_{TX}$), as shown below in Equation 5.

$$I_{CTX}=I_{TX}-I_{RX} \qquad \text{(Eq. 5)}$$

In the same or other embodiments, the voltage source 340-2 included in sensing circuit 310-2 also may be operated to drive an input sensing signal onto the second sensor electrode(s), while the voltage source 340-1 included in sensing circuit 310-1 applies a substantially constant voltage to the non-inverting input of operational amplifier 320-1. That is, the roles of the first sensor electrode(s) and second sensor electrode(s) may be reversed, such that the first sensor electrode(s) are operated as receiver electrode(s) 220, and the second sensor electrode(s) are operated as transmitter electrode(s) 210. The absolute capacitance of the second unknown capacitor 355-2 may then be determined by subtracting the amount of current received by the first sensor electrode(s) from the total amount of current transmitted to the second sensor electrode(s), using Equation 5. Thus, each of the first sensor electrode(s) and the second sensor electrode(s) may be operated for absolute sensing during different time periods. In addition, transcapacitance measurements (e.g., of the unknown capacitor 555) may be acquired while either of the first sensor electrode(s) or second sensor electrode(s) are being operated for absolute sensing.

Accordingly, the sensing circuits 310-1 and 310-2 may be operated to perform transcapacitive sensing in conjunction with absolute capacitance sensing using one or both of the first sensor electrode(s) and the second sensor electrode(s). In order to ensure that the absolute capacitance of each of the first sensor electrode(s) and second sensor electrode(s) (e.g., the first unknown capacitance 355-1 and the second unknown capacitance 355-2, respectively) can be effectively isolated from other unknown capacitances (e.g., the third unknown capacitance 555), the first sensor electrode(s) and second sensor electrode(s) may be operated for absolute sensing during non-overlapping time periods. For example, the roles (e.g., the role of transmitter electrode 210 and the role of receiver electrode 220) of the first sensor electrode(s) and the second sensor electrode(s) may be reversed after each sensing cycle, after multiple sensing cycles, or based on some other input sensing pattern.

Figure 6:
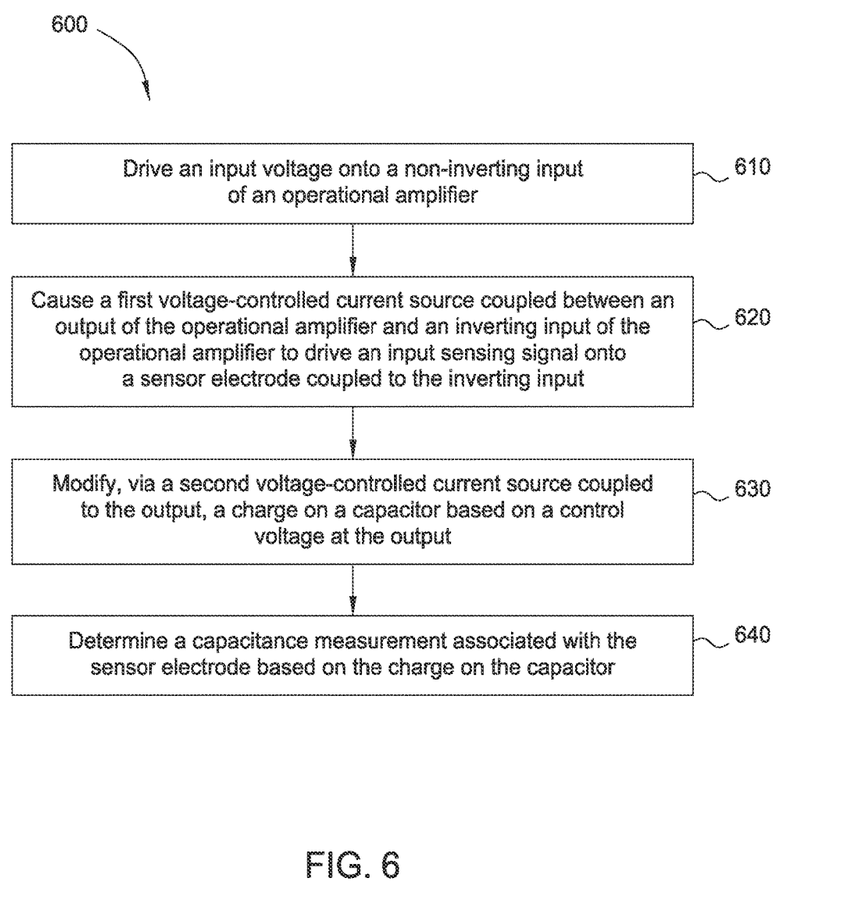
FIG. 6 is a flow chart of a method for performing input sensing using the sensing circuit of FIG. 3 in accordance with embodiments of the invention.

FIG. 6 is a flow chart of a method 600 for performing input sensing using the sensing circuit 310 of FIG. 3 in accordance with embodiments of the invention. Although the method 600 is described in conjunction with FIGS. 1-5, persons skilled in the art will understand that any system configured to perform the method, in any appropriate order, falls within the scope of the present invention.

The method 600 begins at step 610, where the voltage source 340 drives an input voltage onto the non-inverting input 324 of the operational amplifier 320. As described above, a first VCCS 330 is coupled between the output 326 of the operational amplifier 320 and the inverting input 322 of the operational amplifier 320 to form a feedback path 332. Next, at step 620, the control voltage $V_C$ at the output 326 of the operational amplifier 320 causes the first VCCS 330 to drive an input sensing signal onto one or more sensor electrode(s) coupled to the inverting input 322 of the operational amplifier 320.

At step 630, the second VCCS 335 modifies the charge on the known capacitor 350 based on a control voltage $V_C$ at the output 326 of the operational amplifier. Then, at step 640, the determination module 250 determines a capacitance measurement associated with the one or more sensor electrodes based on the charge on the known capacitor 350. For example, the capacitance of the one or more sensor electrodes may be determined based on the voltage $V_O$ across the known capacitor 350.

Figure 7:
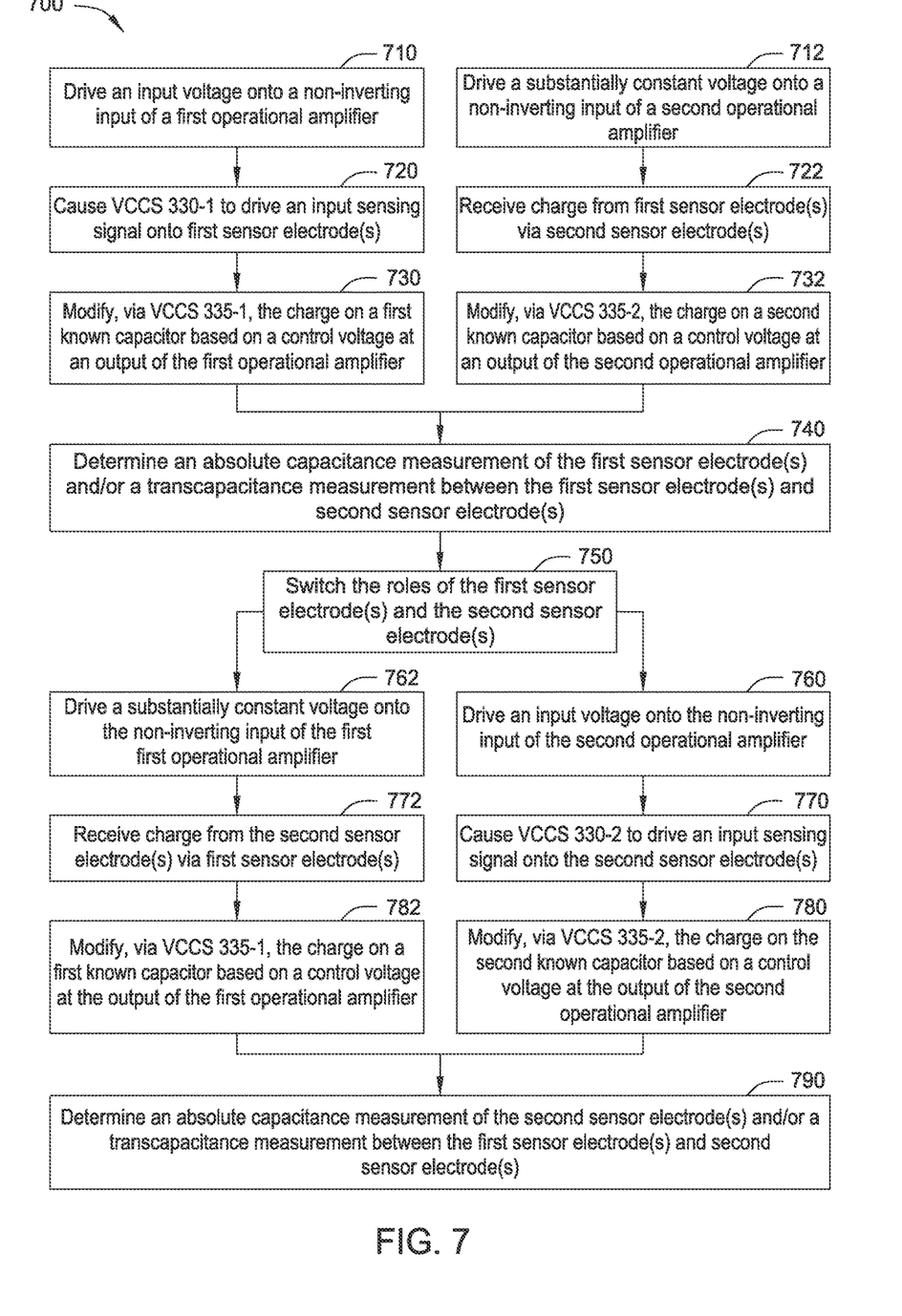
FIG. 7 is a flow chart of a method for performing input sensing using the sensing circuits of FIG. 5 in accordance with embodiments of the invention.

FIG. 7 is a flow chart of a method 700 for performing input sensing using the sensing circuits 310-1, 310-2 of FIG. 5 in accordance with embodiments of the invention. Although the method 700 is described in conjunction with FIGS. 1-5, persons skilled in the art will understand that any system configured to perform the method, in any appropriate order, falls within the scope of the present invention.

The method 700 begins at step 710, where the voltage source 340-1 of sensing circuit 310-1 drives an input voltage onto the non-inverting input of operational amplifier 320-1. At step 712, the voltage source 340-2 of sensing circuit 310-2 drives a substantially constant voltage onto the non-inverting input of operational amplifier 320-2. Next, at step 720, the control voltage $V_C$ at the output 326 of operational amplifier 320-1 causes VCCS 330-1 to drive an input sensing signal onto the first sensor electrode(s). At step 722, the second sensor electrode(s) receive charge from the first sensor electrode(s), for example, via a transcapacitive coupling between the first sensor electrode(s) and the second sensor electrode(s).

At step 730, VCCS 335-1 modifies the charge on the first known capacitor 350-1 based on the control voltage $V_C$ at the output of operational amplifier 320-1. At step 732, VCCS 335-2 modifies the charge on the second known capacitor 350-2 based on the control voltage $V_C'$ at the output of operational amplifier 320-2. Then, at step 740, the determination module 250 determines an absolute capacitance of the first sensor electrode(s) and/or a transcapacitance between the first sensor electrode(s) and the second sensor electrode(s). The absolute capacitance and transcapacitance may be determined, for example, based on Equations 4 and 5, described above. Then, at step 750, the roles of the first sensor electrode(s) and the second sensor electrode(s) are switched, such that the first sensor electrode(s) are operated as receiver electrode(s) 220, and the second sensor electrode(s) are operated as transmitter electrode(s) 210.

Accordingly, at step 760, the voltage source 340-2 of sensing circuit 310-2 drives an input voltage onto the non-inverting input of operational amplifier 320-2. At step 762, the voltage source 340-1 of sensing circuit 310-1 drives a substantially constant voltage onto the non-inverting input of operational amplifier 320-1. Next, at step 770, the control voltage $V_C'$ at the output of operational amplifier 320-2 causes VCCS 330-2 to drive an input sensing signal onto the second sensor electrode(s). At step 772, the first sensor electrode(s) receive charge from the second sensor electrode(s), for example, via a transcapacitive coupling between the first sensor electrode(s) and the second sensor electrode(s).

At step 780, VCCS 335-2 modifies the charge on the second known capacitor 350-2 based on the control voltage $V_C'$ at the output of operational amplifier 320-2. At step 782, VCCS 335-1 modifies the charge on the first known capacitor 350-1 based on the control voltage $V_C$ at the output of operational amplifier 320-1. Then, at step 790, the determination module 250 determines an absolute capacitance of the second sensor electrode(s) and/or a transcapacitance between the first sensor electrode(s) and the second sensor electrode(s), for example, based on Equations 4 and 5, described above. Then, the roles of the first sensor electrode(s) and the second sensor electrode(s) may be switched again, and the method 700 may return to step 710.

In some embodiments, step 710 and step 712 are performed at substantially the same time, and step 720 and step 722 are performed at substantially the same time. Additionally, in some embodiments, step 760 and step 762 are performed at substantially the same time, and step 770 and step 772 are performed at substantially the same time.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

The invention claimed is:

1. A processing system for a capacitive touch sensing device, comprising:
   an operational amplifier having a non-inverting input, an inverting input coupled to a sensor electrode, and an output;
   a voltage source coupled to the non-inverting input and configured to input a control voltage to the operational amplifier;
   a first voltage-controlled current source coupled to the sensor electrode and coupled between the output and the inverting input to form a feedback path to the operational amplifier to modify the control voltage to a modified control voltage and to modify an amount of charge stored in the sensor electrode,
   wherein the operational amplifier is configured to:
      modify the control voltage based on the modified amount of charge stored in the sensor electrode; and
      output the modified control voltage;
   a second voltage-controlled current source coupled between the output and a capacitor and configured to modify a charge on the capacitor based on the modified control voltage at the output; and
   a determination module coupled to the capacitor and configured to determine a capacitance measurement of the sensor electrode based on the modified charge on the capacitor.

2. The processing system of claim 1, wherein the first voltage-controlled current source is configured to modify the amount of charge by driving an input sensing signal onto the sensor electrode based on the control voltage while the second voltage-controlled current source is modifying the charge on the capacitor.

3. The processing system of claim 2, wherein the voltage source is configured to drive an input voltage onto the non-inverting input to cause the first voltage-controlled current source to drive the input sensing signal onto the sensor electrode.

4. The processing system of claim 2, wherein the capacitance measurement comprises a capacitance between the sensor electrode and an input object.

5. The processing system of claim 4, wherein:
   the determination module is further configured to determine a third capacitance measurement between the sensor electrode and the second sensor electrode;
   the capacitance measurement of the sensor electrode and the second capacitance measurement of the second sensor electrode comprise absolute capacitance measurements; and
   the third capacitance measurement between the sensor electrode and the second sensor electrode comprises a transcapacitance measurement.

6. The processing system of claim 2, wherein the capacitance measurement comprises a first capacitance between the sensor electrode and an input object and a second capacitance between the sensor electrode and a receiver electrode.

7. The processing system of claim 1, wherein the capacitance measurement comprises a capacitance between the sensor electrode and a transmitter electrode.

8. The processing system of claim 7, wherein the voltage source is configured to drive a substantially constant input voltage onto the non-inverting input during a mutual capacitance sensing time period.

9. The processing system of claim 8, wherein the first voltage-controlled current source is configured to drive an input sensing signal onto the sensor electrode based on the control voltage during a self capacitance sensing time period.

10. The processing system of claim 1, wherein a capacitance of the capacitor is substantially constant.

11. The processing system of claim 1, further comprising:
    a second operational amplifier having a second non-inverting input, a second inverting input coupled to a second sensor electrode, and a second output, wherein:
       the second non-inverting input is coupled to the non-inverting of operation amplifier;
    a second voltage source coupled to the non-inverting input and configured to input a second control voltage to the second operational amplifier;
    a third voltage-controlled current source coupled to the second sensor electrode and coupled between the second output and the second inverting input to form a second feedback path to the second operational amplifier to modify the second control voltage to a second modified control voltage and to modify a second amount of charge stored in the second sensor electrode,
    wherein the second operational amplifier is configured to:
       modify the second control voltage based on the second modified amount of charge stored in the second sensor electrode; and
       output the second modified control voltage; and
    a fourth voltage-controlled current source coupled between the second output and a second capacitor and configured to modify a charge on the second capacitor based on the second modified control voltage at the second output; wherein:
    the determination module is further configured to determine a second capacitance measurement of the second sensor electrode based on the second modified charge on the second capacitor.

12. A capacitive touch sensing device, comprising:
    a plurality of sensor electrodes; and
    a processing system coupled to the plurality of sensor electrodes, the processing system comprising:

an operational amplifier having a non-inverting input, an inverting input coupled to at least one of the plurality of sensor electrodes, and an output;

a voltage source coupled to the non-inverting input and configured to input a control voltage to the operational amplifier;

a first voltage-controlled current source coupled to the at least one sensor electrode and coupled between the output and the inverting input to form a feedback path to the operational amplifier to modify the control voltage to a modified control voltage and to modify an amount of charge stored in the least one sensor electrode, wherein the operational amplifier is configured to:
modify the control voltage based on the modified amount of charge stored in the at least one sensor electrode; and
output the modified control voltage;

a second voltage-controlled current source coupled between the output and a capacitor and configured to modify a charge on the capacitor based on the modified control voltage at the output; and a determination module coupled to the capacitor and configured to:
determine a capacitance measurement associated with the at least one sensor electrode based on the modified charge on the capacitor; and
determine positional information based on the capacitance measurement.

13. The capacitive touch sensing device of claim 12, wherein the first voltage-controlled current source is configured to modify the amount of charge by driving an input sensing signal onto the at least one sensor electrode based on the control voltage while the second voltage-controlled current source modifies the charge on the capacitor.

14. The capacitive touch sensing device of claim 13, wherein the voltage source is configured to drive an input voltage onto the non-inverting input to cause the first voltage-controlled current source to drive the input sensing signal onto the sensor electrode.

15. The capacitive touch sensing device of claim 13, wherein the capacitance measurement comprises a capacitance between the sensor electrode and an input object.

16. The capacitive touch sensing device of claim 13, wherein the capacitance measurement comprises a first capacitance between the sensor electrode and an input object and a second capacitance between the sensor electrode and a receiver electrode.

17. The capacitive touch sensing device of claim 12, wherein the voltage source is configured to drive a substantially constant input voltage onto the non-inverting input during a mutual capacitance sensing time period, and the capacitance measurement comprises a capacitance between the sensor electrode and a transmitter electrode during the mutual capacitance sensing time period.

18. The capacitive touch sensing device of claim 17, wherein the first voltage-controlled current source is configured to drive an input sensing signal onto the sensor electrode based on the control voltage during a self capacitance sensing time period.

19. A method of capacitive touch sensing with a sensor electrode, the method comprising:
driving an input voltage onto a non-inverting input of an operational amplifier, wherein a first voltage-controlled current source is coupled to the sensor electrode and coupled between an output of the operational amplifier and an inverting input of the operational amplifier to form a feedback path to the operational amplifier to modify the control voltage to a modified control voltage and to modify an amount of charge stored in the sensor electrode, wherein the operational amplifier is configured to:
modify the control voltage based on the modified amount of charge stored in the sensor electrode; and
output the modified control voltage;
modifying, via a second voltage-controlled current source coupled between the output and a capacitor, a charge on the capacitor based on the modified control voltage at the output; and
determining a capacitance measurement associated with the sensor electrode based on the modified charge on the capacitor.

20. The method of claim 19, wherein driving the input voltage onto the non-inverting input causes the first voltage-controlled current source to modify the amount of charge by driving an input sensing signal onto the sensor electrode while the second voltage-controlled current source modifies the charge on the capacitor.

21. The method of claim 20, wherein the capacitance measurement comprises a capacitance between the sensor electrode and an input object.

22. The method of claim 20, wherein the capacitance measurement comprises a first capacitance between the sensor electrode and an input object and a second capacitance between the sensor electrode and a receiver electrode.

23. The method of claim 19, wherein the capacitance measurement comprises a capacitance between the sensor electrode and a transmitter electrode.

24. The method of claim 23, further comprising driving a substantially constant input voltage onto the non-inverting input during a mutual capacitance sensing time period.

25. The method of claim 24, wherein driving the input voltage onto the non-inverting input causes the first voltage-controlled current source to drive an input sensing signal onto the sensor electrode during a self capacitance sensing time period.

* * * * *

UNITED STATES PATENT AND TRADEMARK OFFICE
CERTIFICATE OF CORRECTION

PATENT NO. : 9,891,763 B2  
APPLICATION NO. : 14/502884  
DATED : February 13, 2018  
INVENTOR(S) : Tracy Scott Dattalo Page 1 of 1

It is certified that error appears in the above-identified patent and that said Letters Patent is hereby corrected as shown below:

In Claim 12, after "the" insert -- at --.

Signed and Sealed this  
Twelfth Day of June, 2018

Andrei Iancu  
*Director of the United States Patent and Trademark Office*